(12) United States Patent
Lee et al.

(10) Patent No.: US 8,604,479 B2
(45) Date of Patent: Dec. 10, 2013

(54) DISPLAY SUBSTRATE, METHOD FOR MANUFACTURING THE SAME, AND DISPLAY APPARATUS HAVING THE SAME

(75) Inventors: Jeong-Hyun Lee, Asan-si (KR);
Jeong-Uk Heo, Asan-si (KR); Yeon-Sik Ham, Suwon-si (KR); Ock-Soo Son, Seoul (KR); Yeon-Mun Jeon, Cheonan-si (KR)

(73) Assignee: Samsung Display Co., Ltd., Yongin (KR)

( * ) Notice: Subject to any disclaimer, the term of this patent is extended or adjusted under 35 U.S.C. 154(b) by 33 days.

(21) Appl. No.: 13/226,994

(22) Filed: Sep. 7, 2011

(65) Prior Publication Data
US 2012/0112213 A1 May 10, 2012

(30) Foreign Application Priority Data
Nov. 9, 2010 (KR) .................. 10-2010-0111112

(51) Int. Cl.
*H01L 29/18* (2006.01)
*H01L 31/062* (2012.01)
*H01L 31/113* (2006.01)
*H01L 21/00* (2006.01)

(52) U.S. Cl.
USPC .......... 257/59; 257/88; 257/291; 257/E27.12; 257/E29.273; 438/30

(58) Field of Classification Search
USPC ............. 257/88, 84, 98, E33.001, E33.004, 257/E33.009, E33.064, E33.066, E33.074, 257/223, 227, 291, 439, 57, 59, 72, 83, 257, 257/290, 351, 368, 392, 292, 443, 655, 257/E27.1, E27.125, E27.112, E29.117, 257/E29.145, E29.147, E29.151, E29.182, 257/E29.202, E29.273–E29.299, E29.314, 257/E29.32, E23.016, E21.094, E21.104, 257/E21.121, E21.372, E21.411–E21.416; 438/149, 30, 48, 128, 151, 157, 161, 438/283

See application file for complete search history.

(56) References Cited

U.S. PATENT DOCUMENTS

| | | | |
|---|---|---|---|
| 6,969,872 B2* | 11/2005 | Kim | 257/72 |
| 7,551,253 B2* | 6/2009 | Higa et al. | 349/126 |
| 7,630,045 B2* | 12/2009 | Matsumoto | 349/141 |
| 7,749,907 B2* | 7/2010 | Miyairi et al. | 438/690 |
| 2008/0174729 A1* | 7/2008 | Ohta et al. | 349/147 |

* cited by examiner

Primary Examiner — Andy Huynh
Assistant Examiner — Junita B Rhodes
(74) Attorney, Agent, or Firm — H.C. Park & Associates, PLC

(57) ABSTRACT

A display substrate includes a substrate, a gate line formed on the substrate, a data line formed on the substrate and crossing the gate line, a first pixel electrode formed on the substrate on which the gate and the data line are formed, an insulation layer formed on the substrate and the first pixel electrode, and a second pixel electrode formed on the insulation layer. The second pixel electrode includes a first sub-electrode that overlaps the first pixel electrode and the data line, and a second sub-electrode that is electrically connected to the data line through a switching element.

21 Claims, 19 Drawing Sheets

| BM shift(μm) | TRANSMITTANCE | -3 | -2 | -1 | 0 | 1 | 2 | 3 |
|---|---|---|---|---|---|---|---|---|
| ref | Tmax(%) | 15.59 | 16.35 | 17.08 | 17.40 | 17.11 | 16.39 | 15.63 |
| | ΔT(%) | -10.4 | -6.1 | -1.8 | 0.0 | -1.7 | -5.8 | -10.2 |
| type A | Tmax(%) | 17.50 | 17.65 | 17.63 | 17.60 | 17.62 | 17.66 | 17.52 |
| | ΔT(%) | -0.56 | 0.34 | 0.19 | 0.00 | 0.13 | 0.39 | -0.40 |
| type B | Tmax(%) | 16.57 | 17.16 | 17.71 | 17.98 | 17.72 | 17.16 | 16.57 |
| | ΔT(%) | -7.81 | -4.55 | -1.50 | 0.00 | -1.41 | -4.53 | -7.86 |

DISPLAY SUBSTRATE, METHOD FOR MANUFACTURING THE SAME, AND DISPLAY APPARATUS HAVING THE SAME

CROSS-REFERENCE TO RELATED APPLICATION

This application claims priority from and the benefit of Korean Application No. 2010-0111112, filed on Nov. 9, 2010, which is hereby incorporated by reference for all purposes as if fully set forth herein.

BACKGROUND OF THE INVENTION

1. Field of the Invention

Example embodiments of the present invention relate to a display substrate, a method of manufacturing a display substrate, and a display apparatus having the display substrate.

2. Description of the Related Art

Generally, a liquid crystal display panel includes a display substrate, an upper substrate facing the display substrate, and a liquid crystal layer interposed between the display substrate and the upper substrate. The display substrate includes a display area, on which a plurality of lines and a plurality of transistors connected to the lines are formed, and a peripheral area, on which pads applying an electric signal to the lines are formed.

Conventionally, a TN (twisted nematic) liquid crystal display panel was widely used. Recently, however, a PLS (plane to line switching) liquid crystal display panel is being increasingly used to provide an increased viewing angle.

In the PLS liquid crystal display panel, a gray scale is realized by horizontally aligning liquid crystal particles, using a fringe field formed between a common electrode and a pixel electrode, located on a thin film transistor substrate. To reduce the power consumption of such a liquid crystal display panel, a Middle-Com PLS structure is provided. In the Middle-Com PLS structure, the common electrode is formed under the pixel electrode, and a passivation layer is located between the common electrode and the pixel electrode. A gap between the common electrode and the pixel electrode is small to reduce power consumption.

However, a fringe field at pixel boundaries of the display panel having a Middle-Com PLS structure is weaker than a field at central portions of the pixels. As such, the light transmittance of the display panel is reduced.

SUMMARY OF THE INVENTION

Example embodiments of the present invention provide a display substrate having improved light transmittance in a pixel area, during a PLS mode.

Example embodiments of the present invention further provide a method of is manufacturing the display substrate.

Example embodiments of the present invention further provide a display apparatus including the display substrate.

Additional features of the invention will be set forth in the description which follows, and in part will be apparent from the description, or may be learned by practice of the invention.

An example embodiment of the present invention provides a display substrate that includes: a substrate; a gate line formed on the substrate; a data line formed on the substrate and crossing the gate line; a first pixel electrode formed on the substrate on which the gate and the data line are formed; an insulation layer formed on the first pixel electrode; and a second pixel electrode formed on the substrate. The second pixel electrode includes a first sub-electrode that overlaps the first pixel electrode and the data line, and a second sub-electrode that is electrically connected to the data line through a switching element.

An example embodiment of the present invention provides a method for manufacturing a display substrate, the method including: forming gate lines on a substrate; forming data lines across the gate lines, which are connected to input terminals of switching elements; forming a first pixel electrode on the substrate on which the data lines are formed; forming an insulation layer that covers the first pixel electrode and the substrate; forming a first sub-electrode that overlaps the gate lines and the data lines, and forming a second sub-electrode that is electrically connected to the data line through the switching element.

An example embodiment of the present invention provides a display substrate comprising: a substrate; a gate line formed on the substrate; a data line formed on the substrate and crossing the gate line; a first pixel electrode formed on the substrate on which the data lines and the gate lines are formed; an insulation layer formed on the first pixel electrode; a first sub-electrode overlapping the gate lines and the data lines; a second sub-electrode that is electrically connected to the data line through a switching element, an opposite substrate facing the substrate; a color filter layer disposed on the opposite substrate and overlapping the first sub-electrode; a black matrix disposed on the opposite substrate and overlapping the data line; and a liquid crystal layer interposed between the display substrate and the opposite substrate.

It is to be understood that both the foregoing general description and the following detailed description are example and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
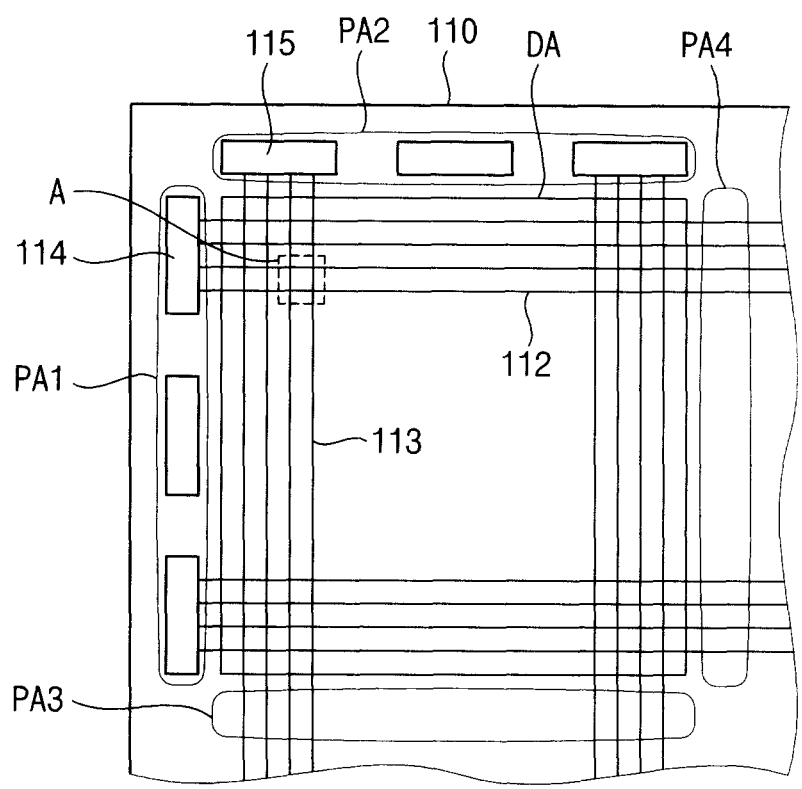
FIG. 1 is a plan view illustrating an example embodiment of a display substrate.
Figure 1:
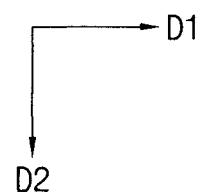

The invention is described more fully hereinafter with reference to the accompanying drawings, in which example embodiments of the invention are shown. This invention may, however, be embodied in many different forms and should not be construed as limited to the example embodiments set forth herein. Rather, these example embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

FIG. 1 is a plan view illustrating a display substrate 100, according to an example embodiment of the present invention. Referring to FIG. 1, the display substrate 100 includes a lower insulation substrate 110. The lower insulation substrate 110 includes a display area DA, first, second, third, and fourth peripheral areas PA1, PA2, PA3, and PA4.

Figure 2:
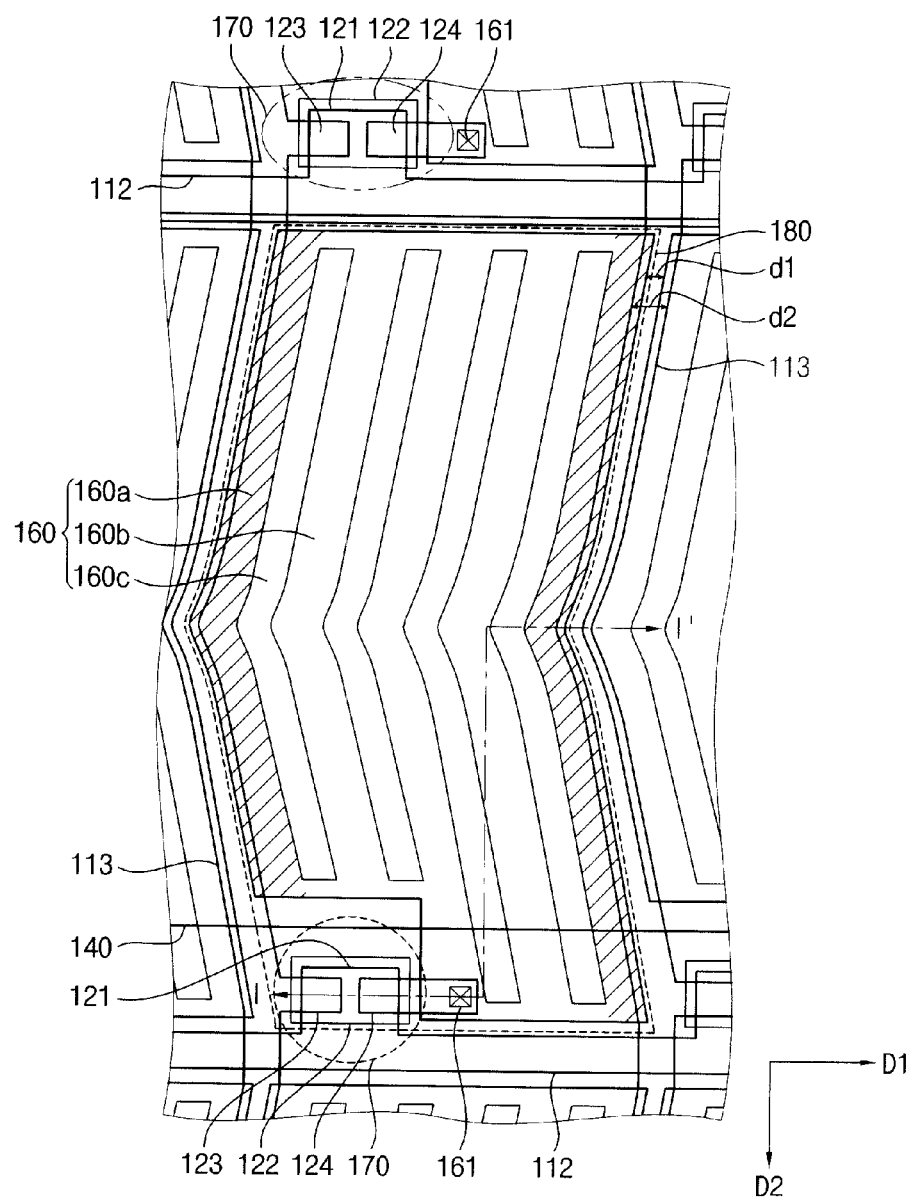
FIG. 2 is a partial enlarged plan view illustrating A of FIG. 1.

The display area DA includes a plurality of signal lines and a plurality of pixels 180 (FIG. 2). The signal lines include a plurality of gate lines 112 and a plurality of data lines 113. The gate lines 112 may extend along a first direction D1. The data lines 113 may extend along a second direction D2, across the gate lines 112. The first direction D1 and the second direction D2 may be generally perpendicular to each other.

Each of the pixels 180 is an area where a pixel electrode is formed, which is surrounded by the data lines 113 and the gate lines 112. The first peripheral area PA1 is adjacent to end portions of the gate lines 112. A plurality of gate pads 114, which are electrically is connected to a gate driving circuit sequentially providing gate signals to the gate lines 112, are formed on the first peripheral area PA1. The gate driving circuit may be formed directly on a display substrate, using the same process used to form a switching element of the pixels 180.

The second peripheral area PA2 is adjacent to end portions of the data lines 113. A data pad 115, which receives a display signal provided to the data line 113, is formed on the second peripheral area PA2.

Figure 3:
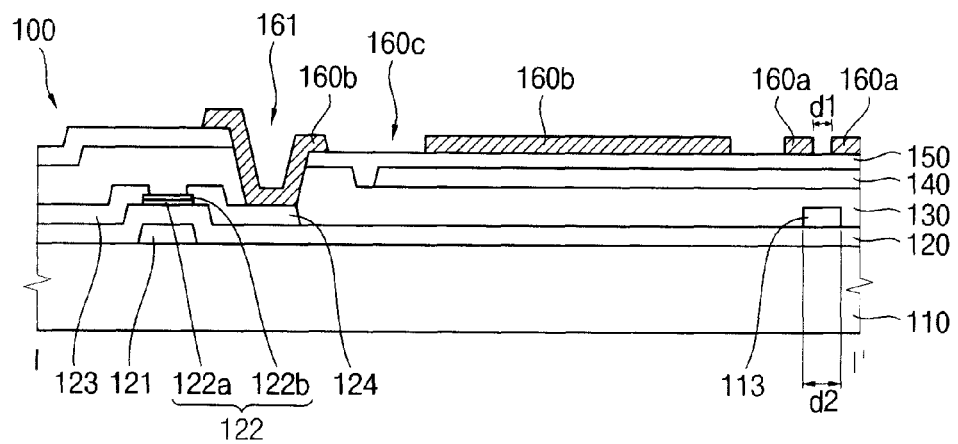
FIG. 3 is a cross-sectional view taken along line I-I' of FIG. 2.

FIG. 2 is a partial enlarged plan view illustrating a pixel 180 in an area A of FIG. 1. FIG. 3 is a cross-sectional view taken along line I-I' of FIG. 2. Referring to FIG. 2 and FIG. 3, the pixel 180 includes a switching element 170, a first pixel electrode 140, and a second pixel electrode 160. The pixel 180 includes the second pixel electrode 160. Thus, the pixel 180 includes a portion overlapping a portion of the data line 113, as illustrated in FIG. 2. The switching element 170 includes a gate electrode 121, a semiconductor pattern 122, a source electrode 123, and a drain electrode 124. The second pixel electrode 160 includes a first sub-electrode 160a overlapping the data line 113, and a second sub-electrode 160b formed at a central portion of the pixel 180.

The gate line 112 and the gate electrode 121 are formed on the lower insulation substrate 110. The gate line 112 extends along the first direction D1. The gate electrode 121 extends from the gate line 112 and is formed on the pixel 180.

A gate insulation layer 120 is formed on the lower insulation substrate 110, on which the gate line 112 and the gate electrode 121 are formed. The gate insulation layer 120 includes a transparent insulation material. Examples of the transparent insulation material may include silicon nitride, silicon oxide, and the like.

The semiconductor pattern 122 is formed on the gate insulation layer 120. The is semiconductor pattern 122 includes an amorphous silicon pattern 122a and an n+ amorphous silicon pattern 122b, which are sequentially deposited, and overlaps the gate electrode 121. The data lines 113, the source electrode 123, and the drain electrode 124 are formed on the gate insulation layer 120.

The data lines 113 extend along the second direction D2. The data lines 113 may be symmetrically bent in the first direction D1, at a center portion of the pixel 180. For example, the data lines 113 may have a V-shape with respect to the first direction D1.

The source and the drain electrodes 123 and 124 respectively overlap portions of the semiconductor pattern 122, and are spaced apart from each other. The source electrode 123 extends from the data line 113. The drain electrode 124 is electrically connected to the second sub-electrode 160b.

A first passivation layer 130 is formed on the lower insulation substrate, on which the switching element 170 and the data line 113 are formed. The first passivation layer 130 covers the source electrode 123, the drain electrode 124, the data line 113, and the semiconductor pattern 122. The first passivation layer 130 includes a first contact hole 161 exposing the drain electrode 124. The first passivation layer 130 may include a transparent insulation material. Examples of the transparent insulation material may include silicon nitride, silicon oxide, and the like.

The first pixel electrode 140 is formed on the first passivation layer 130. The first pixel electrode 140 may include a transparent conductive oxide material. Examples of the transparent conductive oxide material may include indium tin oxide (ITO), indium zinc oxide (IZO), and the like. These materials can be used each alone or in a combination thereof.

A second passivation layer 150 is formed on the lower insulation substrate 110, on which the first pixel electrode 140 is formed. The second passivation layer 150 covers the first pixel electrode 140. The second passivation layer 150 includes a first contact hole 161 exposing the drain electrode 124. The second passivation layer 150 may include a transparent insulation material. Examples of the transparent insulation material may include silicon nitride, silicon oxide, and the like.

The second pixel electrode 160 overlaps the first pixel electrode 140 and is formed on the lower insulation substrate 110, on which the second passivation layer 150 is formed. The second pixel electrode 160 includes a plurality of generally bar-shaped electrodes and a plurality of openings 160c disposed between the electrodes. End portions of the electrodes are connected to each other. Therefore, the openings 160c are disposed between the electrodes. The electrodes and the openings 160c extend lengthwise, in a direction generally parallel to the data lines 113, and are symmetrically bent in the first direction D1, at a center portion of the pixel 180. The second pixel electrode 160 may include a transparent conductive oxide material. Examples of the transparent conductive oxide material may include indium tin oxide (ITO), indium zinc oxide (IZO), and the like. These materials can be used each alone or in a combination thereof.

Some of the bar-shaped electrodes, which are formed in a peripheral area of the pixel 180 and overlap a portion of the data line 113, are the first sub-electrodes 160a. The first sub-electrodes 160a are spaced apart from and electrically insulated from the first sub-electrodes 160a of adjacent pixels. A distance d1 between adjacent first sub-electrodes 160a may be less than a width d2 of the data line 113.

Some of the bar-shaped electrodes, which are formed in a center area of the pixel 180, are the second sub-electrode 160b. The second sub-electrode 160b is electrically connected to the drain electrode 124 through the first contact hole 161, to receive a data signal of the data line 113. Both end portions of the first and second sub-electrodes 160a and 160b are connected to each other, so that the data signal of the data line 113 is applied to the first sub-electrodes 160a through the second sub-electrodes 160b. Thus, the first and second sub-electrodes 160a and 160b are applied with the same voltage.

Figure 4:
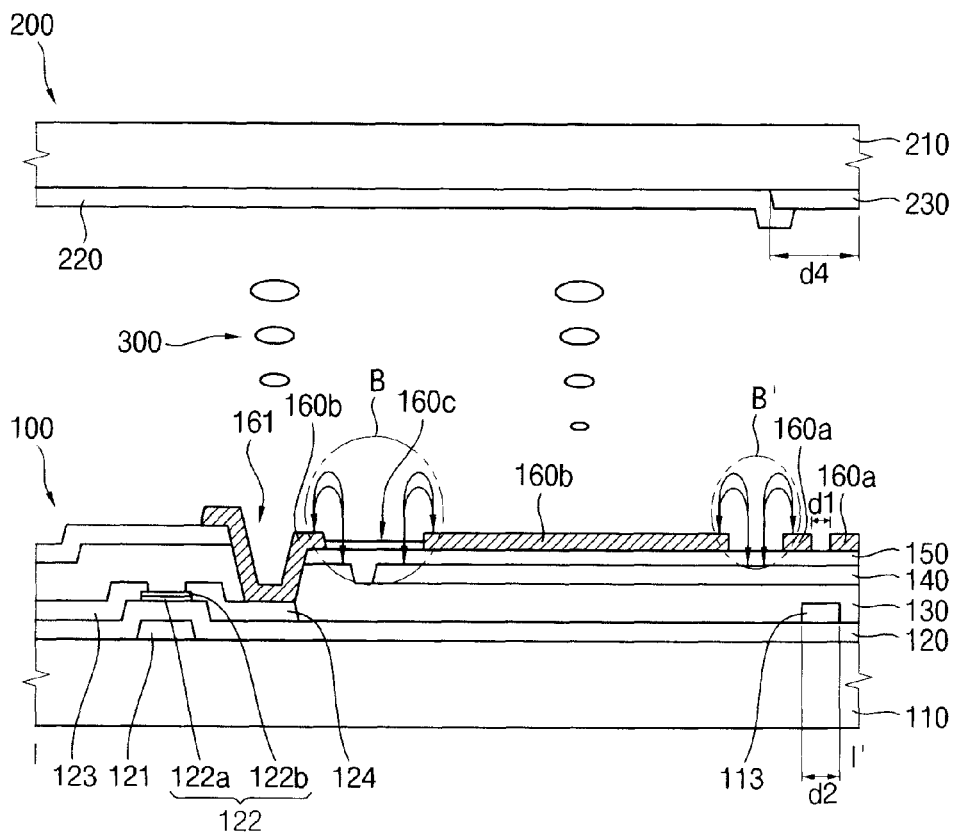
FIG. 4 is a cross-sectional view illustrating a liquid crystal display panel including the display substrate of FIG. 1.

FIG. 4 is a cross-sectional view illustrating a liquid crystal display panel including the display substrate 100 of FIG. 1. Referring to FIG. 2, FIG. 3, and FIG. 4, the liquid crystal display panel includes an upper substrate 200, the display substrate 100, and a liquid crystal layer 300 interposed the upper substrate 200 and the display substrate 100.

The upper substrate 200 includes an upper insulation substrate 210, a black matrix 230, and a color filter 220. The black matrix 230 is formed on the data line 113, and overlaps the data line 113 and the first sub-electrode 160a. In some embodiments, the black matrix 230 may entirely overlap the first sub-electrode 160a. The second sub-electrode 160b, which doesn't overlap the black matrix 230, is formed at a central portion of the pixel 180.

An electric field is formed in the liquid crystal layer 300, by a voltage difference between the second sub-electrode 160b and the first pixel electrode 140, as shown in a region B. Furthermore, since the first sub-electrode 160a is formed under the black matrix 230, an electric field is formed by a voltage difference between the first sub-electrode 160a and the first pixel electrode 140, at a boundary of the pixel 180, as shown in region B'. When a data signal is applied to the pixel 180, liquid crystal molecules a peripheral portion of the pixel 180 are rotated along with liquid crystal molecules at a central portion of the pixel 180. As such, the transmittance of the entire pixel is improved.

Figure 5:
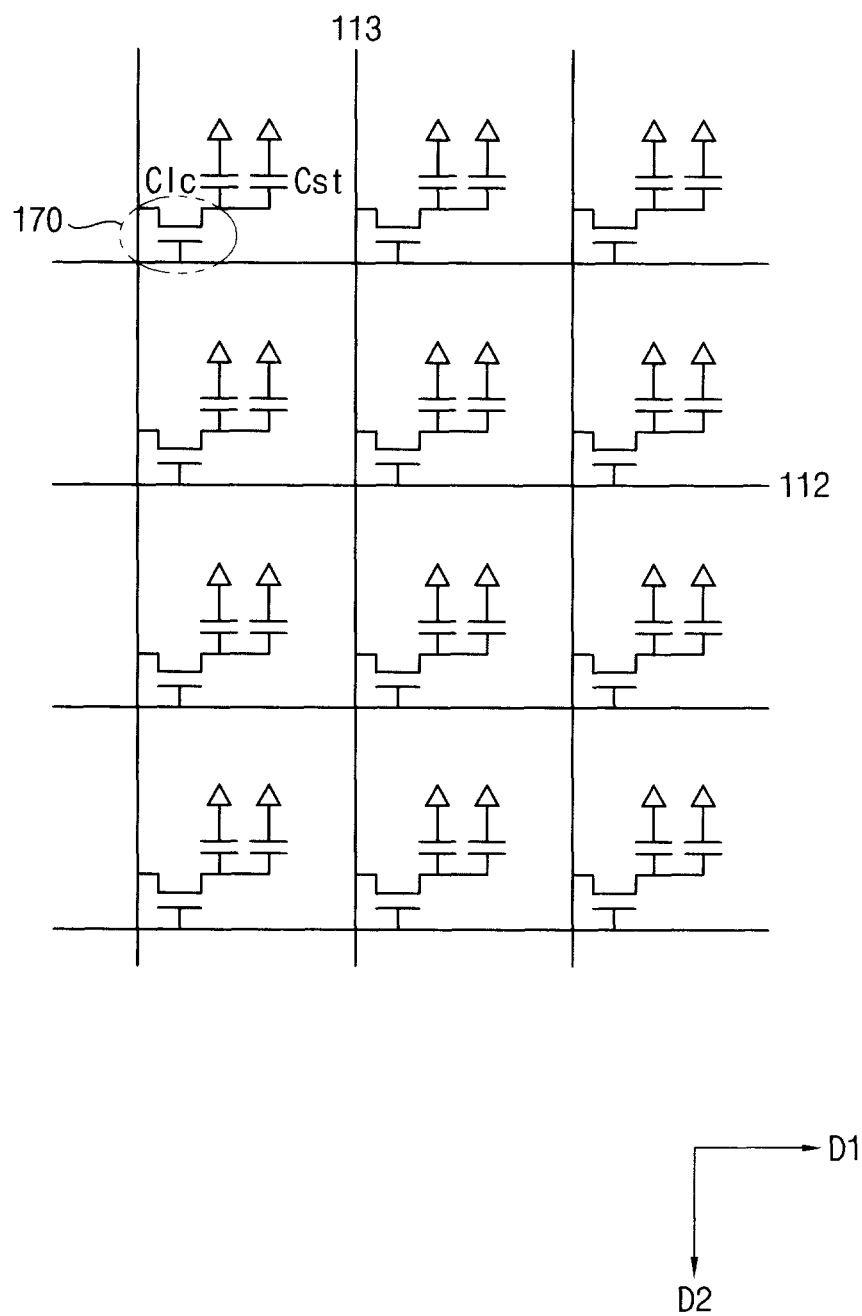
FIG. 5 is a circuit diagram schematically illustrating connections between elements on display substrate of FIG. 1.

FIG. 5 is a circuit diagram schematically illustrating a connection relationship of elements of the display substrate of FIG. 1. Referring to FIG. 5, the switching element 170 is electrically connected to a gate line 112 and a data line 113. As switched by a gate signal of the gate line 112, the switching element 170 applies a data signal of the data line 113 to a liquid crystal cell Clc, which is also connected to a storage capacitor Cst. Switching elements 170 may be disposed along a second direction D2, with respect to one of data lines 113.

Figure 6A:
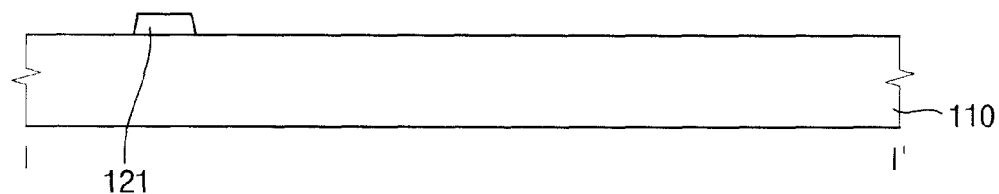
FIG. 6A, FIG. 6B, FIG. 6C, FIG. 6D, FIG. 6E, FIG. 6F, FIG. 6G, FIG. 6H and FIG. 6I are cross-sectional views about a method for manufacturing a display substrate.
Figure 6B:
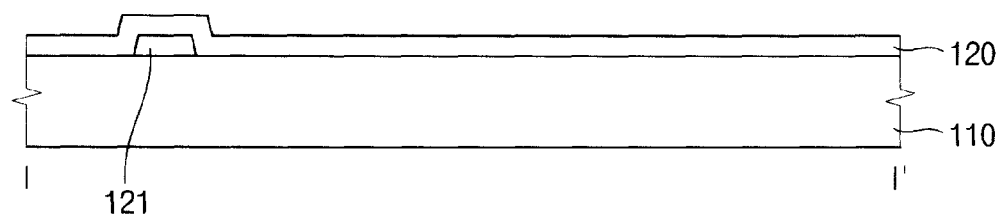

FIG. 6A to 6I are cross-sectional views illustrating a method for manufacturing the display substrate illustrated of FIG. 1. Referring to FIG. 2, FIG. 3, and FIG. 6A, a gate metal layer (not shown) is formed on a lower insulation substrate 110. The gate metal layer may be deposited via a sputtering process. The gate metal layer may be formed as a single layer or as multiple layers. Thereafter, a gate electrode 121 and a gate line 112 are formed via a photo lithography process Referring to FIG. 2, FIG. 3, and FIG. 6B, a gate insulation layer 120 is formed on the lower insulation substrate 110, on which the gate electrode 121 and the gate line 112 are formed. The gate insulation layer 120 may be deposited via plasma enhanced chemical vapor deposition (PECVD). The gate insulation layer 120 may have a double-layered structure having two layers including different materials and/or formed through different processes.

Figure 6C:
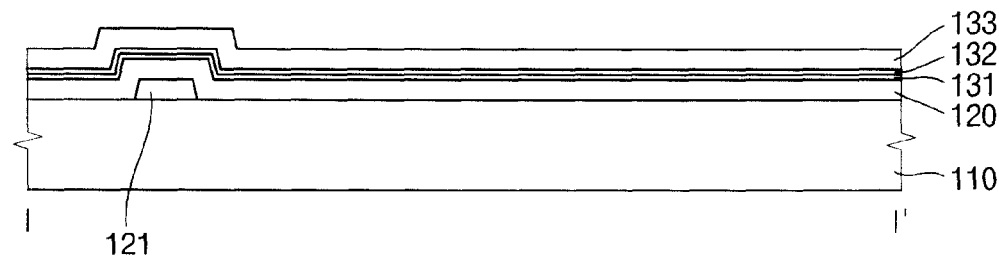

Referring to FIG. 2, FIG. 3, and FIG. 6C, a primitive amorphous silicon layer 131 and an n+ amorphous silicon layer 132 are formed on the lower insulation substrate 110 on which the gate insulation layer 120 is formed. The primitive amorphous silicon layer 131 and the n+ amorphous silicon layer 132 may be deposited via a single chemical vapor deposition (CVD) process. Alternatively, the n+ amorphous silicon layer 132 may be formed by injecting n+ ions into the primitive amorphous silicon layer 131.

A metal data layer 133 is formed on the lower insulation substrate 110, on which the n+ amorphous silicon layer 132 is formed. Examples of a material that may be used for the metal data layer 133 may include chrome, aluminum, tantalum, molybdenum, titanium, tungsten, copper, silver, an alloy thereof, and the like. The metal data layer 133 may be deposited via a sputtering process.

Figure 6D:
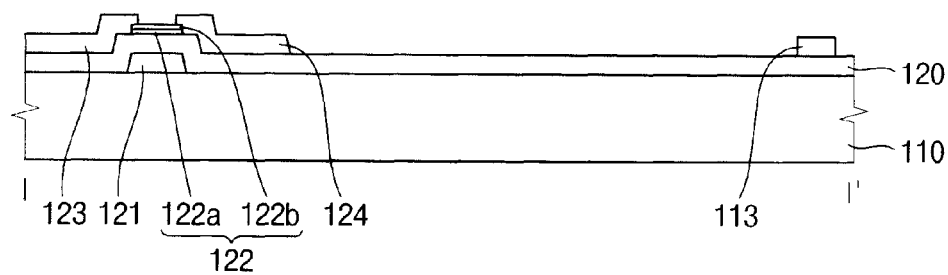

Referring to FIG. 2, FIG. 3, and FIG. 6d, the metal data layer 133, the primitive amorphous silicon layer 131, and the n+ amorphous silicon layer 132 are etched via a photo lithography process. The metal data layer 133, the primitive amorphous silicon layer 131, and the n+ amorphous silicon layer 132 may be etched at the same time or sequentially. A data line 113, a source electrode 123, and a drain electrode 124 are formed by partially etching the metal data layer 133. A semiconductor pattern, including an amorphous silicon pattern 122a and an n+ amorphous silicon pattern 122b, is formed by partially etching the primitive amorphous silicon layer 131 and the n+ amorphous silicon layer 132.

Figure 6E:
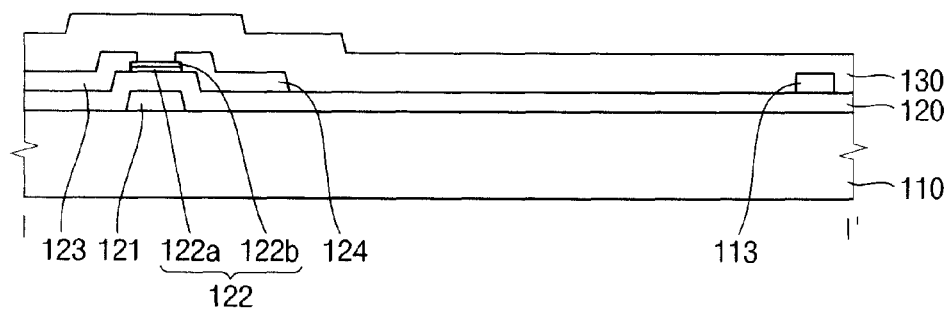

Referring to FIG. 2, FIG. 3, and FIG. 6e, a first passivation layer 130 is formed on the lower insulation substrate 110. The first passivation layer 130 covers the source electrode 123, the drain electrode 124, and the semiconductor pattern 122. The first passivation layer 130 may be formed via plasma enhanced chemical Vapor deposition (PECVD).

Figure 6F:
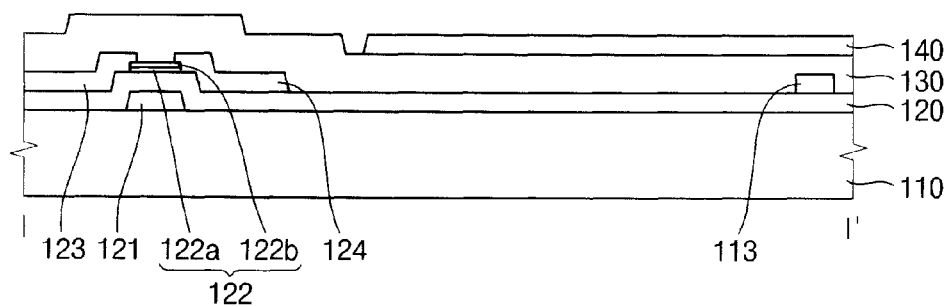

Referring to FIG. 2, FIG. 3, and FIG. 6F, a first transparent electrode layer (not shown) is formed on the lower insulation substrate. The first transparent electrode layer may include a transparent conductive oxide material. The first transparent electrode layer may be deposited via a sputtering process. Thereafter, the first pixel electrode 140 is formed by etching a portion of the first transparent electrode layer corresponding to the switching element 170, via a photo lithography process.

Figure 6G:
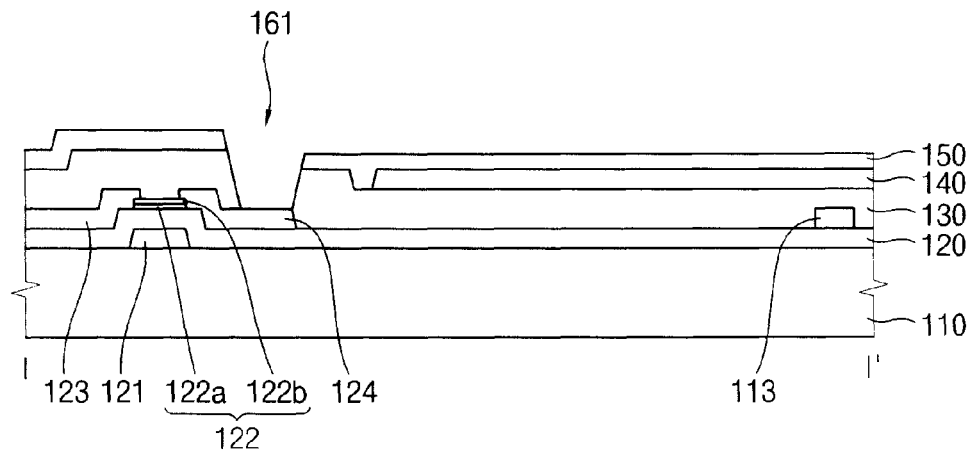

Referring to FIG. 2, FIG. 3, and FIG. 6G, the second passivation layer 150 is formed on the lower insulation substrate 110, so as to cover the first pixel electrode 140. The second passivation layer 150 may include a transparent insulation material.

The second passivation layer 150 may be formed via plasma enhanced chemical vapor deposition (PECVD). Thereafter, a first contact hole 161 is formed through the first and second passivation layers 130, 150, via an etching process, to expose the drain electrode 124.

Figure 6H:
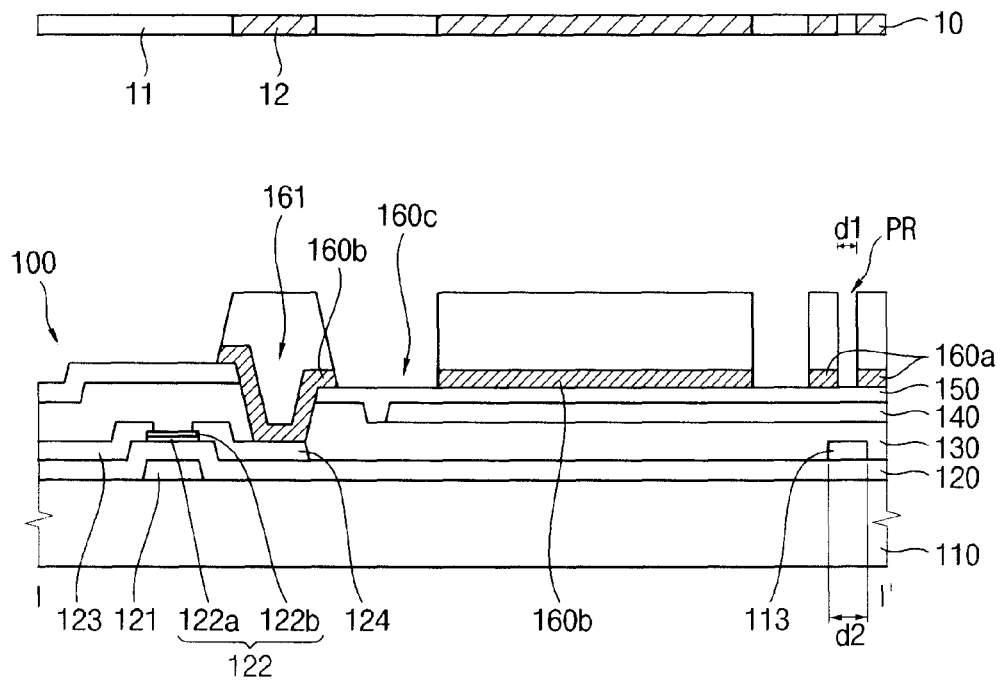

Referring to FIG. 2, FIG. 3, and FIG. 6H, a second transparent electrode layer (not shown) is formed on the second passivation layer 150. The second transparent electrode may include a transparent conductive oxide material. Examples of the transparent conductive oxide material may include indium tin oxide ITO, indium zinc oxide IZO, and the like. These materials can be used each alone or in combination. The second transparent electrode layer may be deposited via a sputtering process.

Thereafter, a first photoresist layer is formed on the second transparent electrode layer. The first photoresist layer may be formed by a developing process, after an exposure process using a first mask 10. The first mask 10 includes a light-transmitting portion 11 and a light-blocking portion 12. The first photoresist layer corresponding to the light-blocking portion 12 is not removed by a developing solution, and remains on the second transparent electrode layer. The first photoresist layer corresponding to the light-transmitting portion 11 is removed by the developing solution. Thus, a first photoresist pattern PR is formed on the second transparent electrode layer. Thereafter, a portion of the second transparent electrode layer is removed using the first photoresist pattern PR as an etch stop layer.

Figure 6I:
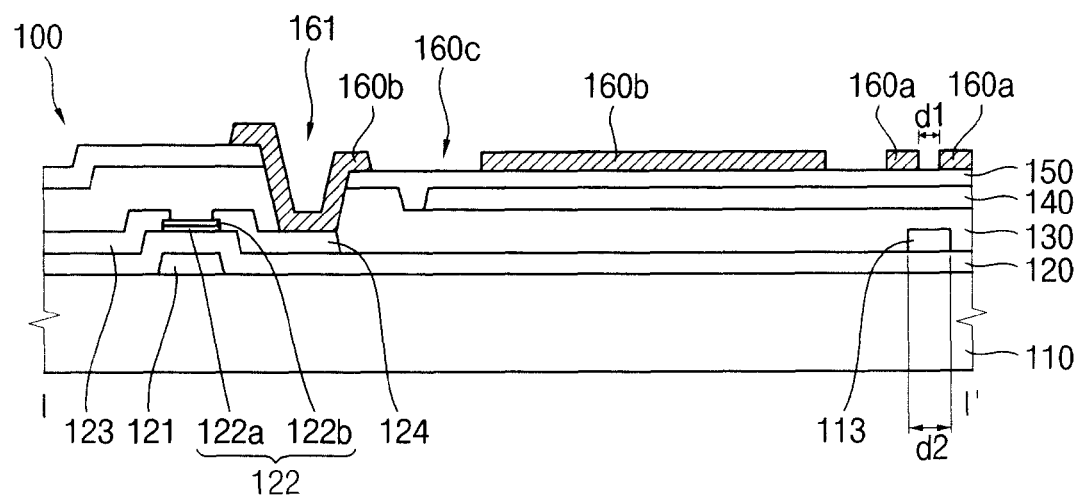

Referring to FIG. 2, FIG. 3, and FIG. 6I, the first photoresist pattern PR is removed by a stripper. Thus, a second pixel electrode 160, including the first and second sub-electrodes 160a and 160b, is formed.

According to an example embodiment of the present invention, a PLS mode display substrate, which has the first and second pixel electrode formed thereon, may be manufactured. In the example embodiment, a first sub-electrode is formed on a data line, so that a fringe field is formed at a peripheral portion of a pixel, between the first sub-electrode and the first pixel electrode. Therefore, liquid crystal molecules at the peripheral portion of the pixel may be rotated, so that the transmittance of the liquid crystal panel may be improved.

The method for manufacturing a display substrate may be formed via different process operations than the process operations recited above. As such, the present invention is not limited to the exemplified process operations.

Figure 7:
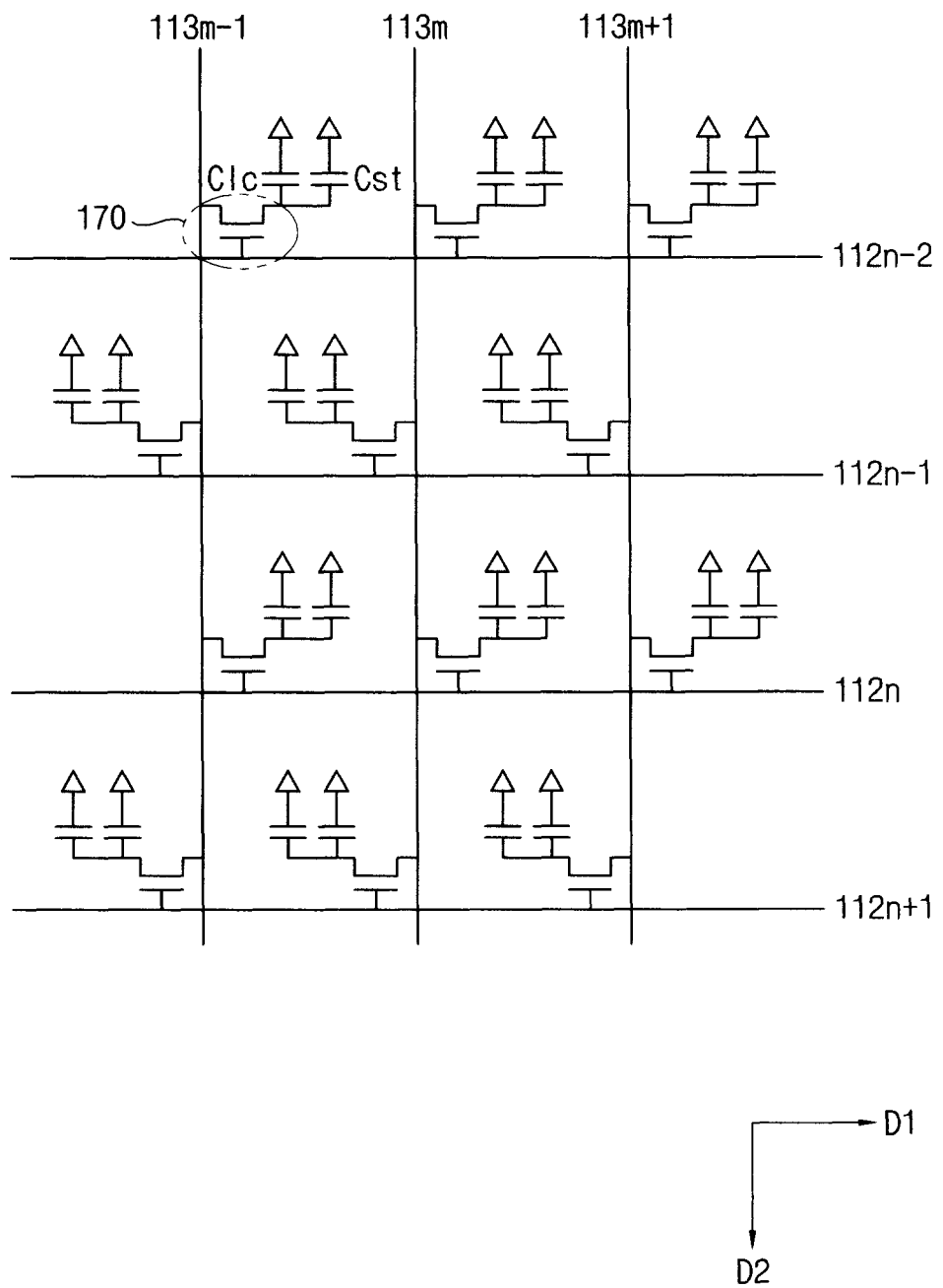
FIG. 7 is a circuit diagram schematically illustrating connections between elements on a display substrate, according to another example embodiment.

FIG. 7 is a circuit diagram schematically illustrating the connections of elements on the display substrate of FIG. 1. The display substrate of FIG. 7 is substantially same as the display substrate of FIGS. 1 to 5, except for the connections between the elements. As such, only the differences there between will be described in detail.

Referring to FIG. 7, the switching elements 170 are alternately formed along opposing sides of an m-th data line 113m extending in a second direction D2. More particularly, switching elements 170 connected to a gate line 112n are connected to corresponding data lines 113m−1, 113m, and 113m+1, disposed on the left side of each corresponding pixel.

The (n−1)-th gate line 112n−1 is disposed adjacent to the n-th gate line 112n. The switching elements 170 connected to an (n−1)-th gate line 112n−1 are connected to corresponding data lines 113m−1, 113m, and 113m+1, disposed on the right side of each corresponding pixel. In a direction D2, the switching elements 170 are disposed on opposing sides of the data lines 113−1, 113m, and 113m+1. In other words, in the second direction D2 the switching elements 170 are disposed on opposing sides of each adjacent pixel.

A data signal for a vertical inversion may be applied to the data lines 113m−1, 113m, and 113m+1. More particularly, a data signal of positive voltage is applied to the data line 113m, for example, during a frame. A data signal of negative voltage is applied to data lines 113m−1, and 113m+1 adjacent to the data line 113m. During a subsequent frame, a data signal of negative voltage is applied to the data line 113m, and a data signal of positive voltage is applied to the data lines 113m−1 and 113m+1. As a result, the pixels are driven according to a dot inversion method.

Such driving method is referred as a z-inversion method. In the z-inversion method, a voltage is applied in the same manner as in a column inversion method, but the effectiveness is same as the dot-inversion method. Thus, power consumption may be decreased by about 30%, as compared to the dot-inversion method.

Figure 8:
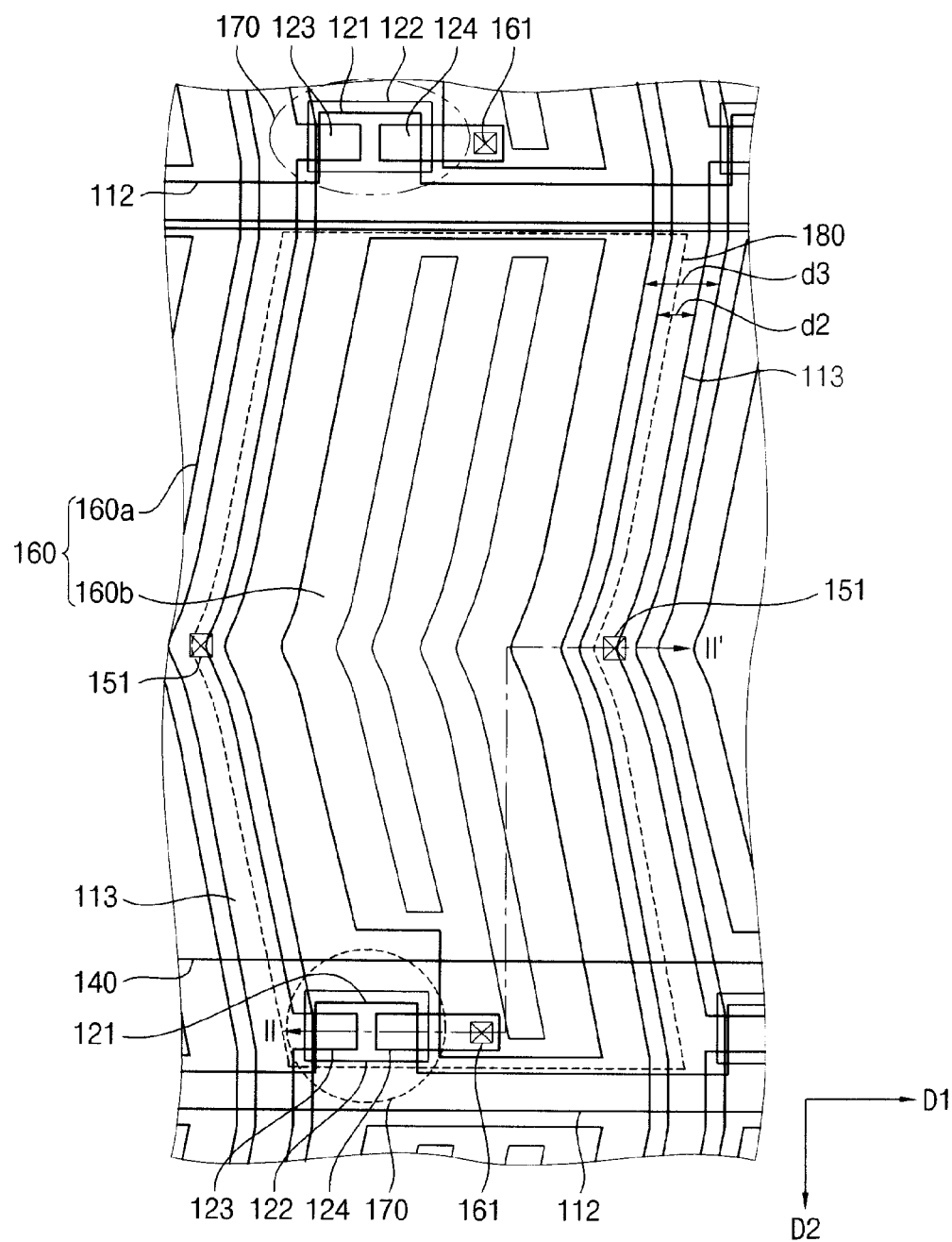
FIG. 8 is an enlarged plan view illustrating a pixel part of display panel, according to another example embodiment.
Figure 9:
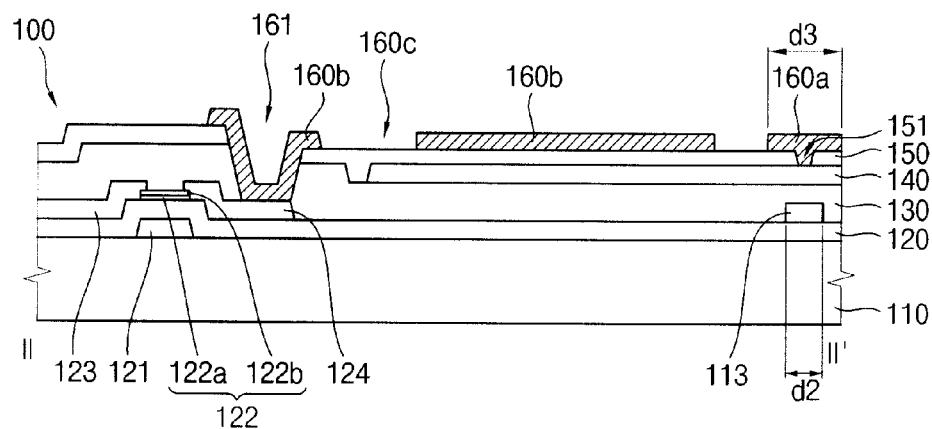
FIG. 9 is a cross-sectional view taken along line II-II' of FIG. 8.

FIG. 8 is an enlarged plan view illustrating a display panel, according to another example embodiment of the present invention. FIG. 9 is a cross-sectional view taken along line II-II' of FIG. 8. The display substrate of FIG. 8 is substantially same as the display substrate of FIGS. 1 to 4, except for the shape of a first sub-electrode and the connections the first sub-electrode and a first pixel electrode. As such, only the differences there between will be described in detail.

Referring to FIG. 1, FIG. 8, and FIG. 9, the second passivation layer 150 is formed on the lower insulation substrate 110, so as to cover the first pixel electrode 140. A second contact hole 151 exposing the first pixel electrode 140 is formed through the second passivation layer 150. The second contact hole 151 may be formed on a data line 113.

The second pixel electrode 160 is formed on the lower insulation substrate 110 on which a second passivation layer 150 is formed. The second pixel electrode 160 includes the first and second sub-electrodes 160a and 160b.

The first sub-electrode 160a entirely overlaps a data line 113, and extends along the data line 113. The first sub-electrode 160a extends to an outside of a pixel 180 along the second direction D2, such that the first sub-electrode 160a is integrally formed with another first sub-electrode of an adjacent pixel. Width d3 of the first sub-electrode 160a integrally formed with another first sub-electrode of an adjacent pixel may be wider than width d2 of the data line 113. The first sub-electrode 160a is electrically connected to the first pixel electrode 140 through the second contact hole 151. Thus, the first sub-electrode 160a maintains a same voltage as the first pixel electrode 140.

The second sub-electrode 160b is spaced apart from the first sub-electrode 160a, and has an island shape at a center portion of the pixel 180, and is electrically insulated from the first sub-electrode 160a. The second sub-electrode 160b includes a plurality of bar-shaped electrodes and a plurality of openings 160c. Both end portions of the bar-shaped electrodes are connected to each other. The bar-shaped electrodes and the openings 160c extend generally parallel to the data line 113, and are symmetrically bent with respect to the first direction D1, at a center portion of the pixel 180. The second sub-electrode 160b is electrically connected to a drain electrode 124.

Figure 10:
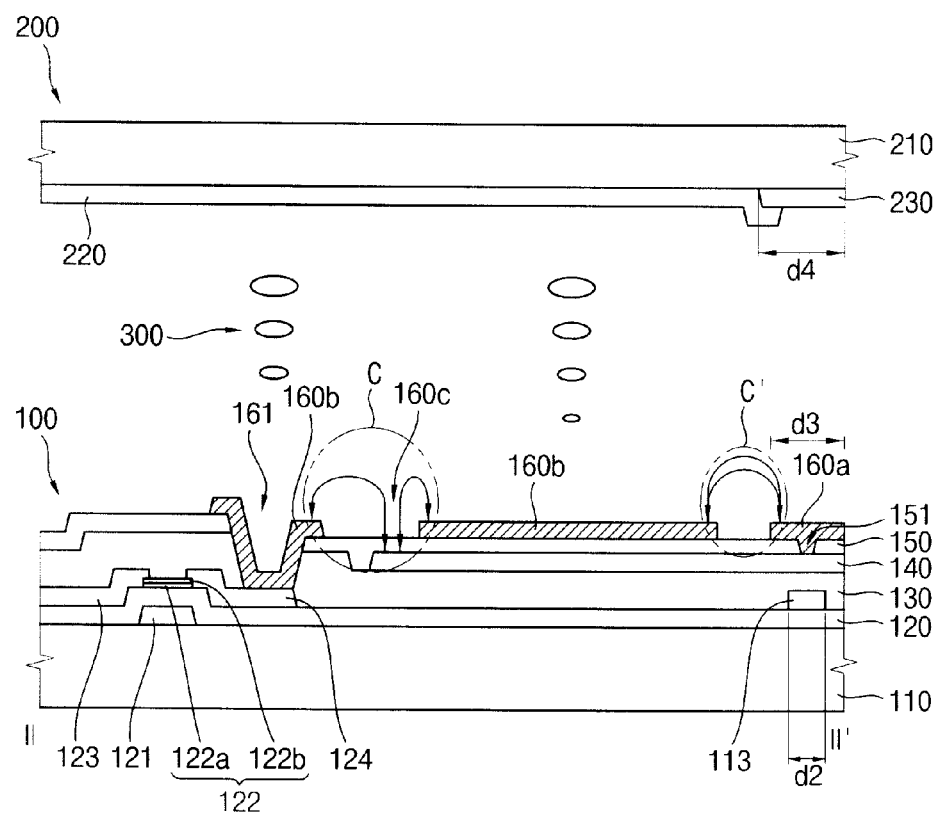
FIG. 10 is a cross-sectional view illustrating a liquid crystal display panel including the display substrate of FIG. 8.

FIG. 10 is a cross-sectional view illustrating a liquid crystal display panel including the display substrate of FIG. 8. Referring to FIG. 8, FIG. 9 and FIG. 10, a black matrix 230, which is formed on an upper substrate 200, is formed on the data line 113, and entirely overlaps the first sub-electrode 160a. A width d4 of the black matrix 230 may be wider than a width d3 of the first sub-electrode 160a integrally formed with a first sub-electrode of an adjacent pixel. The second sub-electrode 160b does not overlap the black matrix 230, and is formed at a center portion of the pixel 180.

An electric field is formed by a voltage difference between a second sub-electrode 160b and the first pixel electrode 140 in a liquid crystal layer 300 of the display panel. (See C region). Furthermore, the first sub-electrode 160a is formed under the black matrix 230. Thus, an electric field is formed by a voltage difference between the first sub-electrode 160a and the second sub-electrode 160b at a boundary of the pixel 180 (See C' region). Thus, when a data signal is applied to the pixel 180, a liquid crystal layer at a peripheral portion of the pixel 180 is rotated with a liquid crystal layer at a center portion of the pixel 180. Thus, a transmittance of a whole pixel is improved.

The display substrate in the example embodiment may have a connection relationship same as elements illustrated in FIG. 5 or FIG. 6.

According to an example embodiment of the present invention, a display substrate of PLS mode, which has the first and second pixel electrode formed thereon, may be manufactured. In the example embodiment, a first sub-electrode is formed on a data line. Thus, a fringe field is formed by the first sub-electrode and the first pixel electrode. Therefore, a liquid crystal at a peripheral portion of the pixel may be rotated, so a transmittance of a liquid crystal panel may be improved.

When different voltages are applied to adjacent first sub-electrodes of the display substrate illustrated in FIG. 1 to FIG. 4, light leakage may occur in an adjacent area of the first sub-electrode. In contrast, according to the example embodiment of the present invention, a first sub-electrode is integrally formed with a first sub-electrode of an adjacent pixel, so that a same voltage is applied thereto. Therefore, light leakage does not occur in an adjacent area of the first sub-electrode.

Figure 11A:
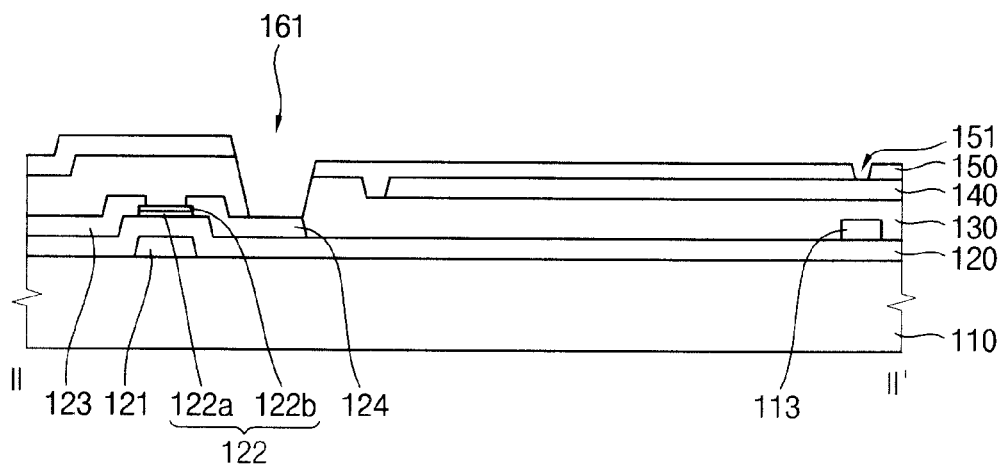
FIG. 11A, FIG. 11B, and FIG. 11C are cross-sectional views about a method for manufacturing a display substrate of FIG. 8.
Figure 11B:
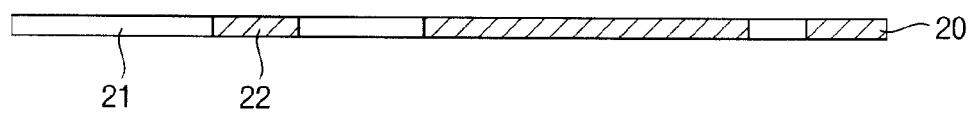
Figure 11B:
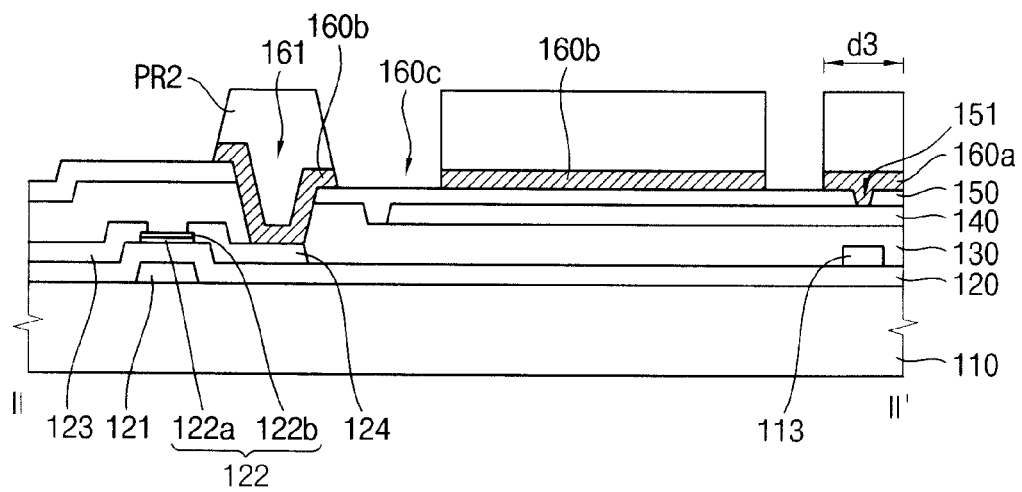
Figure 11C:
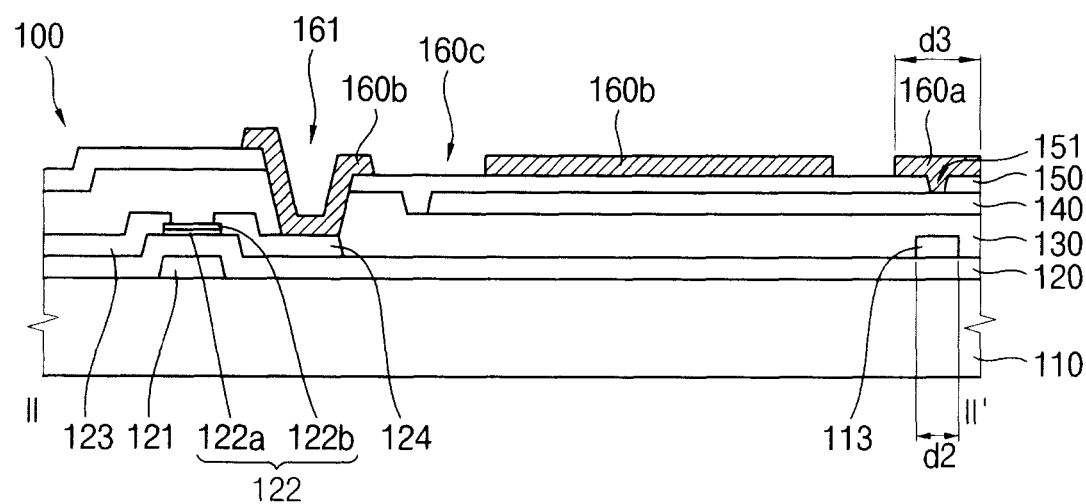

FIG. 11A to 11C are cross-sectional views illustrating a method for manufacturing a display substrate of FIG. 8. A method for manufacturing a display substrate according to the example embodiment is substantially same as a method for manufacturing a display substrate of FIG. 1 to FIG. 4 except for a structure of a first sub-electrode and connections between a first sub-electrode and a pixel electrode. Therefore the forming of a gate electrode 121, a gate line 112, a gate insulation layer 120, semiconductor pattern 122, a source electrode 123, a drain electrode 124, the first passivation layer 130, and first pixel electrode 140, is the same as described in FIG. 1 to FIG. 4. As such, only the differences there between will be described in detail.

Referring to FIG. 1, FIG. 8, and FIG. 11A, the second passivation layer 150 is formed on the lower insulation substrate 110, on which the first pixel electrode 140 is formed. The second passivation layer 150 may be formed via plasma enhanced chemical vapor deposition (PECVD).

Thereafter, via an etching process, a first contact hole 161 is formed through the first and second passivation layers 130 and 150 and exposes the drain electrode 124. A second contact hole 151 is formed through the second passivation layer 150 and exposes the first pixel electrode 140. The second contact hole 151 may be formed on the data line 113.

Referring to FIG. 1, FIG. 8, and FIG. 11B, a second transparent electrode layer (not shown) is formed on the second passivation layer 150. The second transparent electrode layer may include a transparent conductive oxide material. The second transparent electrode layer may be deposited via a sputtering process.

Thereafter, the second photoresist layer is formed on the second transparent electrode layer. The second photoresist layer may be formed by a developing process, after an exposure process using a second mask 20. The second mask 20 includes a light-transmitting portion 21 and a light-blocking portion 22. The second photoresist layer corresponding to the light-blocking portion 22 is not removed by a developing solution, and remains on the second transparent electrode layer. The second photoresist layer corresponding to the light-transmitting portion 21 is removed by a developing solution. Thus, a second photoresist pattern PR2 is formed on the second transparent electrode layer. Thereafter, a portion of the second transparent electrode layer is removed using the second photoresist pattern PR2 as an etch stop layer.

Referring to FIG. 1, FIG. 8 and FIG. 11C, the second photoresist pattern PR2 is removed by a stripper. Thus, a second pixel electrode 160 including the first and second sub-electrodes 160a and 160b is formed.

According to an example embodiment of the present invention, a first sub-electrode is formed on a data line, so that a fringe field is formed at a peripheral portion of a pixel, between the first sub-electrode and the first pixel electrode. Therefore, liquid crystal molecules at the peripheral portion of the pixel may be rotated, so that a transmittance of a liquid crystal panel may be improved.

Furthermore, a first sub-electrode is integrally formed with a first sub-electrode of an adjacent pixel, so that a same voltage is applied thereto. Therefore, light leakage does not occur in an adjacent area of the first sub-electrode.

The present method may be modified in various ways. As such, the present invention is not limited to any particular operations or order of operations.

Figure 12:
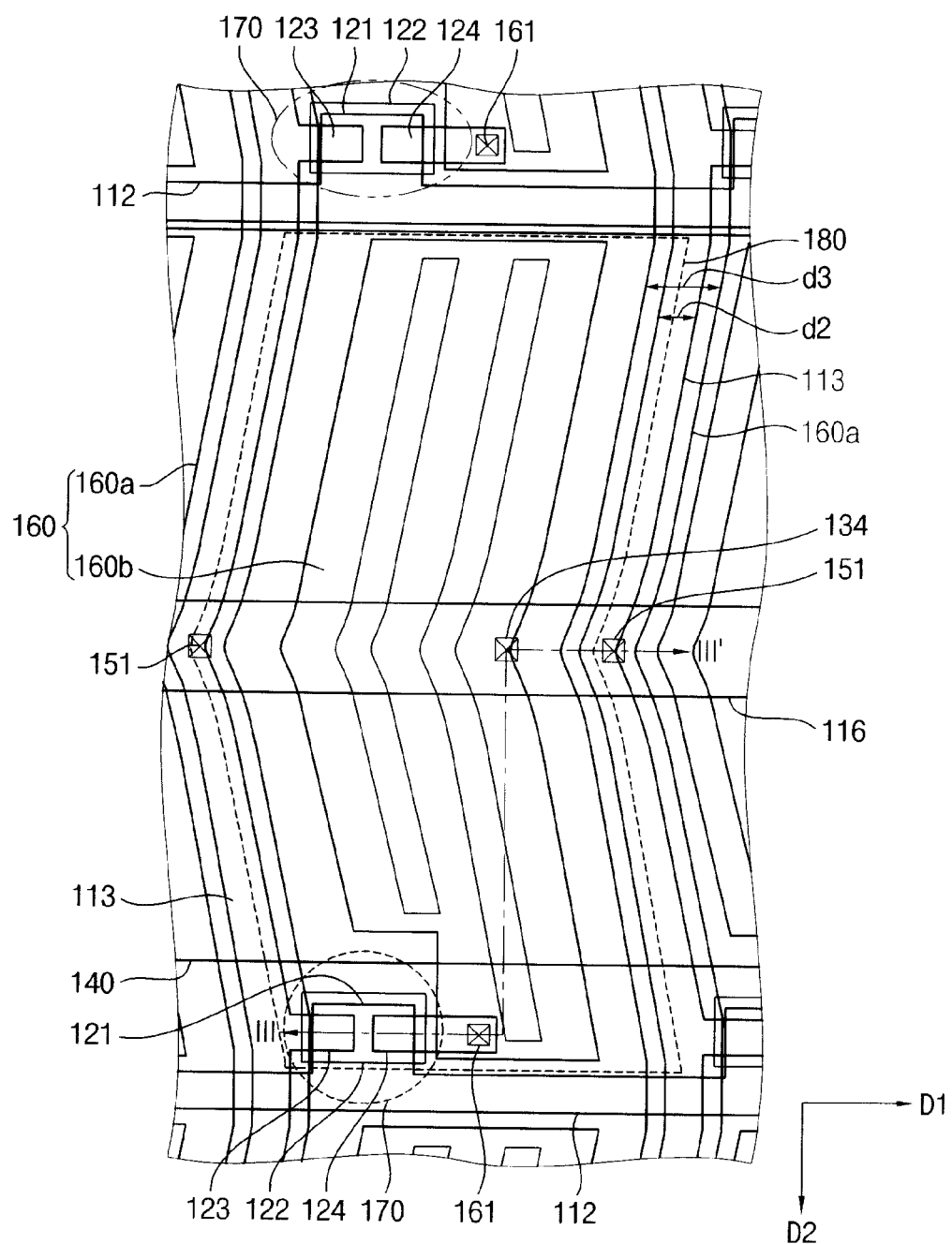
FIG. 12 is an enlarged plan view illustrating a pixel of display panel, according to another example embodiment.
Figure 13:
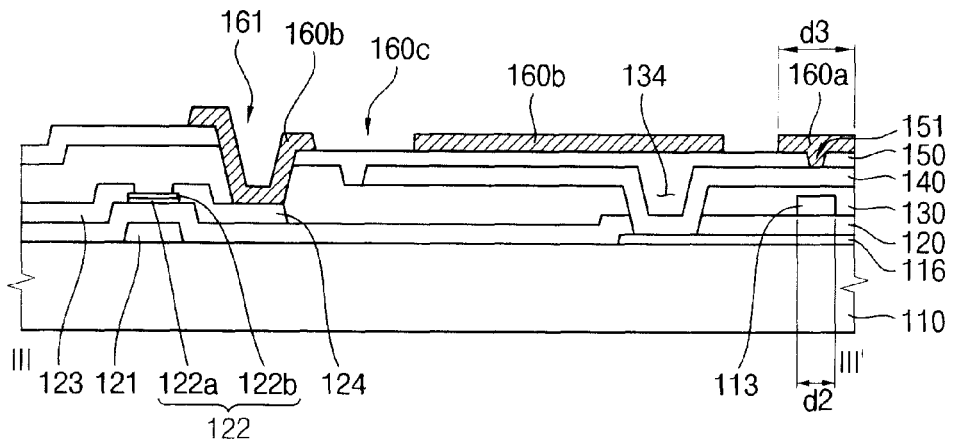
FIG. 13 is a cross-sectional view taken along line III-III' of FIG. 12.

FIG. 12 is an enlarged plan view illustrating a pixel part of a display panel, according to another example embodiment of the present invention. FIG. 13 is a cross-sectional view taken along line III-III' of FIG. 12. The display substrate of FIG. 12 is substantially the same as that of FIG. 8 to FIG. 10, except for the forming of a common voltage line and a third contact hole. As such, only the differences there between will be described in detail.

The display substrate of FIG. 12 includes a common voltage line 116 crossing a center portion of the pixel and extending in parallel to a gate line 112 disposed on lower insulation substrate 110. The common voltage line 116 is electrically connected to a first pixel electrode 140. The common voltage line 116 applies a common voltage to the first pixel electrode 140.

A first passivation layer 130 is formed on the lower insulation substrate 110, on which the common voltage line 116 is formed. The first passivation layer 130 includes a third contact hole 134. The third contact hole 134 is formed through the gate insulation layer 120 and the first passivation layer 130, to expose the common voltage line 116.

The first pixel electrode 140 is formed on the first passivation layer 130. The first pixel electrode 140 is electrically connected to the common voltage line 116 through the third contact hole 134.

Figure 14:
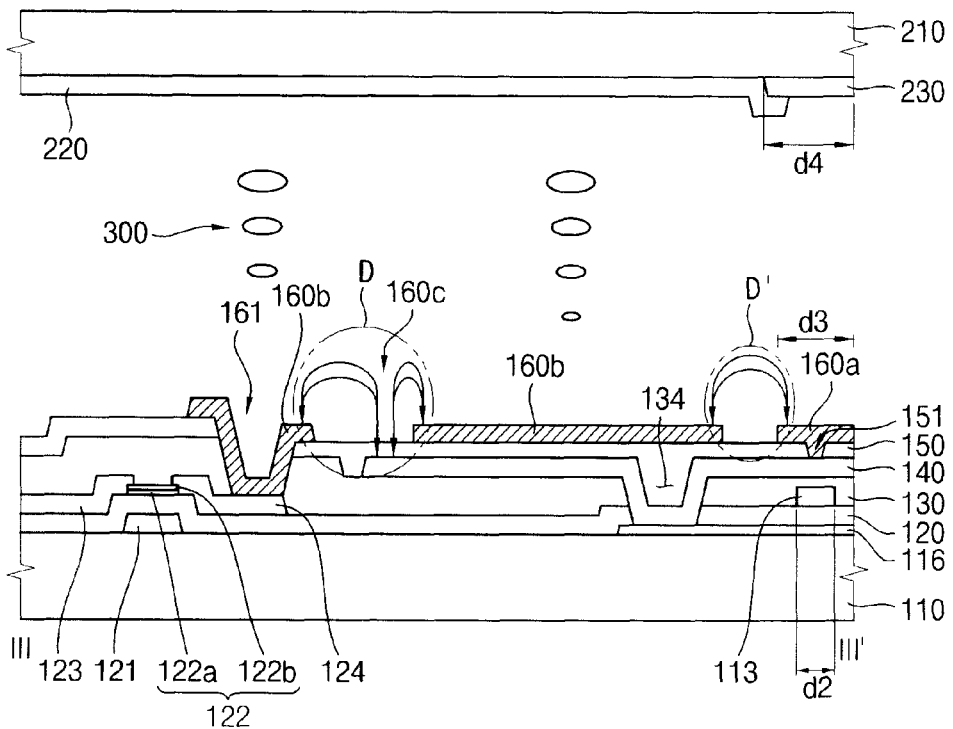
FIG. 14 is a cross-sectional view illustrating a liquid crystal display panel including the display substrate of FIG. 12.

FIG. 14 is a cross-sectional view illustrating a liquid crystal display panel including the display substrate of FIG. 12. Referring to FIG. 14, an electric field is formed by a voltage difference between a second sub-electrode 160b and the first pixel electrode 140 in a region D, in a liquid crystal layer 300 of the display panel. Furthermore, the first sub-electrode 160a is formed under the black matrix 230. Thus, an electric field is formed by a voltage difference between the first sub-electrode 160a and the second sub-electrode 160b, at a boundary region D' of the pixel 180. Thus, when a data signal is applied to the pixel 180, liquid crystal molecules a peripheral portion of the pixel 180 are rotated with liquid crystal molecules at a center portion of the pixel 180. Thus, a transmittance of the entire pixel is improved.

A first sub-electrode is integrally formed with a first sub-electrode of an adjacent pixel, along the second direction D2, so that a same voltage is applied thereto. Therefore, light leakage does not occur in an adjacent area of the first sub-electrode. The display substrate of FIG. 14 may have similar connections as illustrated in FIG. 5 or FIG. 6.

FIG. 15A to 15E are cross-sectional views illustrating a method for manufacturing the display substrate of FIG. 12. A method for manufacturing the display substrate of FIG. 15 is substantially same as that of FIG. 8 to FIG. 10, except for the forming of a common voltage line and a third contact hole. As such, only the differences there between will be described in detail.

Figure 15A:
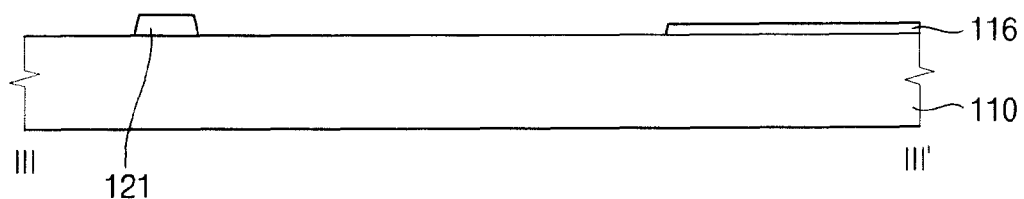
FIGS. 15A, 15B, 15C, 15D, and 15E are cross-sectional views illustrating a method for manufacturing a display substrate of FIG. 12.

Referring to FIG. 12, FIG. 13, and FIG. 15A, a metal gate layer (not shown) is formed on a lower insulation substrate 110. Thereafter, the metal gate layer may be deposited via a sputtering process. A gate line 112, a gate electrode 121 protruding from the gate line 112, and a common voltage line 116 extending parallel with the gate line 112 and crossing a center portion of the pixel, are formed via a photo lithography process.

Figure 15B:
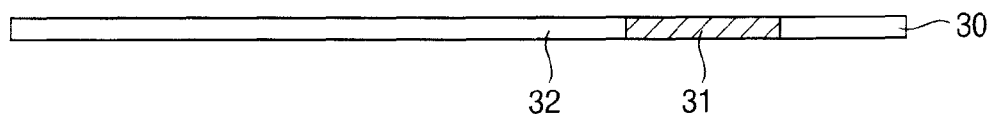
Figure 15B:
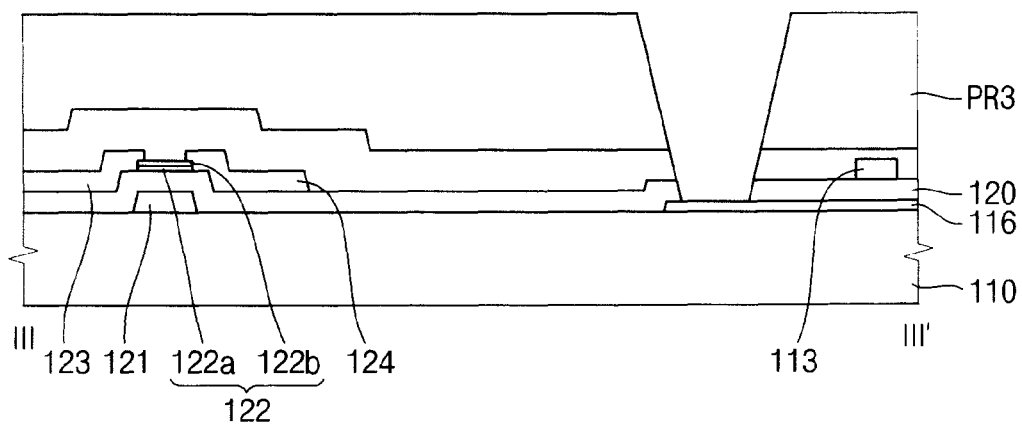

Referring to FIG. 12 FIG. 13, and FIG. 15B, a first passivation layer 130 is formed the upper insulation substrate 110. The first passivation layer 130 may be formed via plasma enhanced chemical vapor deposition (PECVD).

Thereafter, a third photoresist layer is formed on the first passivation layer 130. The third photoresist layer may be formed by a developing process, after an exposure process using a third mask 30. The third mask 30 includes a light-transmitting portion 31 and a light-blocking portion 32. The portion of the third photoresist layer corresponding to the light-blocking portion 32 is not removed by a developing solution, and remains on the first passivation layer 130. A third photoresist layer corresponding to the light-transmitting portion 31 is removed by a developing solution. Thus, a third photoresist pattern PR3 is formed on the first passivation layer 130. Thereafter, a portion of the first passivation layer 130 is removed using is the third photoresist pattern PR3 as an etch stop layer.

Figure 15C:
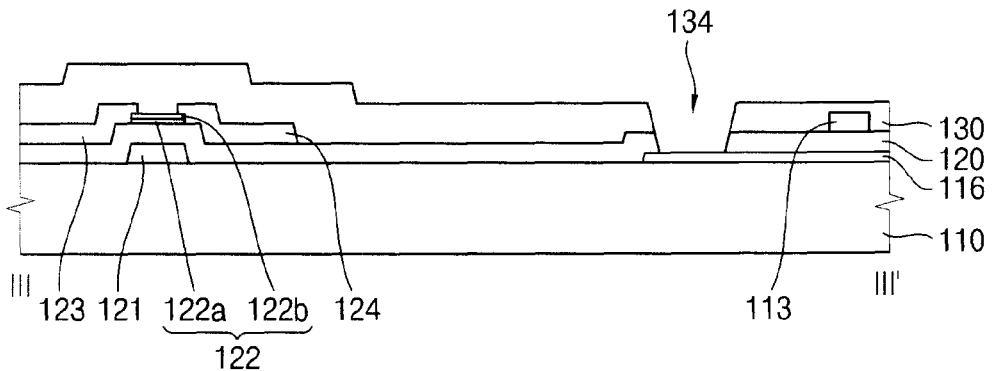

Referring to FIG. 12 FIG. 13 and FIG. 15C, the third photoresist pattern PR3 is removed by a stripper. Thus, a third contact hole 134 is formed to expose the common voltage line 116.

Figure 15D:
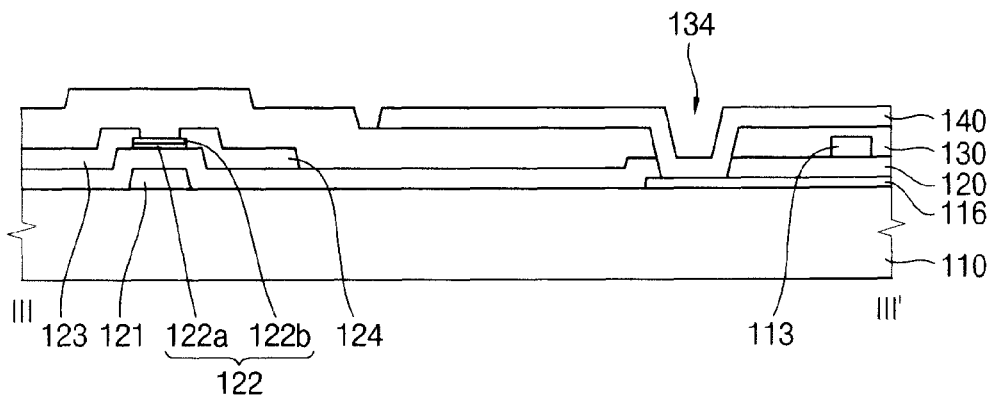

Referring to FIG. 12, FIG. 13, and FIG. 15D, a first transparent electrode layer (not shown) is formed on the lower insulation substrate. The first transparent electrode layer may be deposited via a sputtering process.

Thereafter, the first pixel electrode 140 is formed by patterning the first transparent electrode layer via a photo lithography process. The first pixel electrode 140 is formed entirely on the pixel except for the switching element 170. The first pixel electrode 140 is electrically connected to the common voltage line 116 through the third contact hole 134.

Figure 15E:
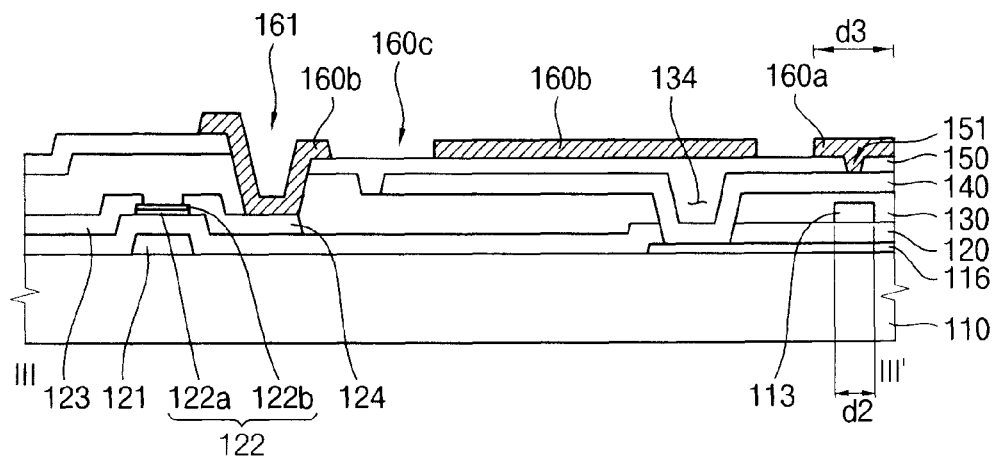

Referring to FIG. 12, FIG. 13, and FIG. 15E, a second transparent electrode layer (not shown) is formed on the second passivation layer 150. The second transparent electrode layer may be deposited via a sputtering process. Thereafter, the second pixel electrode 160 including first and second sub-electrodes 160a and 160b is formed, by patterning the second transparent electrode layer via a photo lithography process.

According to the method for manufacturing a display substrate of the example embodiment, a first sub-electrode is formed on a data line, so that a fringe field is formed at peripheral portion of a pixel, between the first sub-electrode and the first pixel electrode. Therefore, liquid crystal molecules at the peripheral portion of the pixel may be rotated, so that a transmittance of a liquid crystal panel may be improved.

A first sub-electrode is integrally formed with a first sub-electrode of an adjacent pixel, so that a same voltage is applied thereto. Therefore, light leakage does not occur in an area adjacent to the first sub-electrode.

Figure 16:
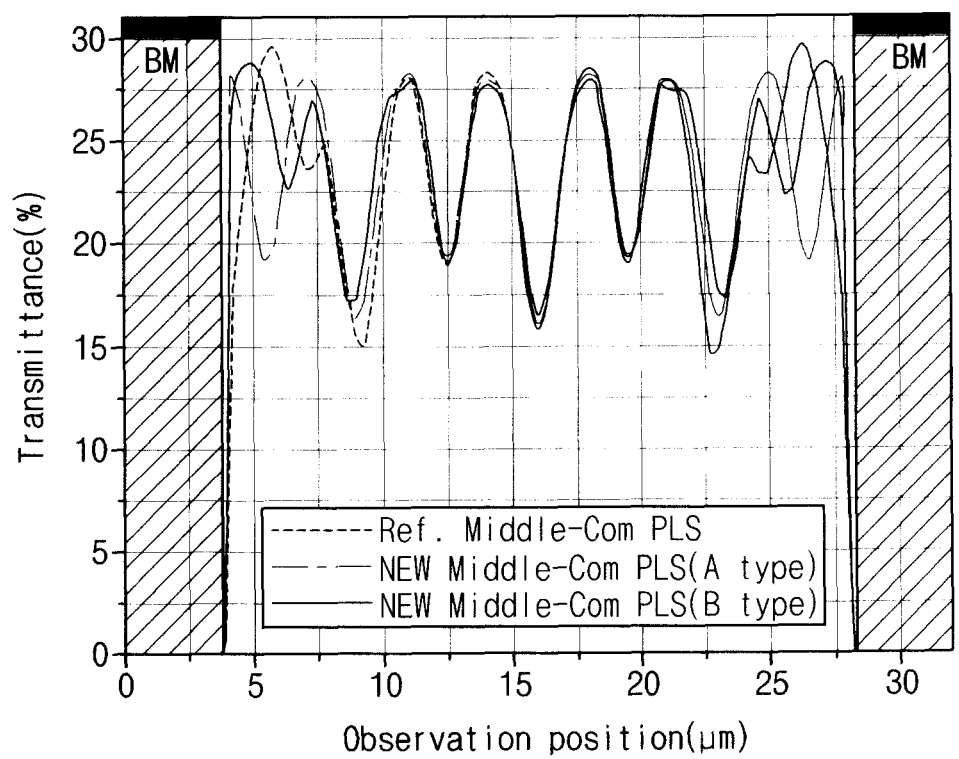
FIG. 16 is a graph showing a transmittance of the pixel of FIG. 8.

FIG. 16 is a graph showing a transmittance of the pixel of FIG. 8. Referring to FIG. 16, graphs show a pixel transmittance of a conventional Middle-Com PLS display substrate (Ref)., a pixel transmittance of a Middle-Com PLS display substrate illustrated in FIG. 2 (A-type), and a pixel transmittance of a Middle-Com PLS display substrate illustrated in FIG. 8 (B-type).

Referring to the graphs, a pixel transmittance of peripheral portion of a black matrix BM in one pixel can be noted. The display substrates of the A-type and B-type have transmittances that are improved about 7% to 8%, as compared to a conventional display substrate. Thus, it can be noted that a pixel transmittance may be improved by forming a first sub-electrode under a black matrix and on a data line.

Figure 17:
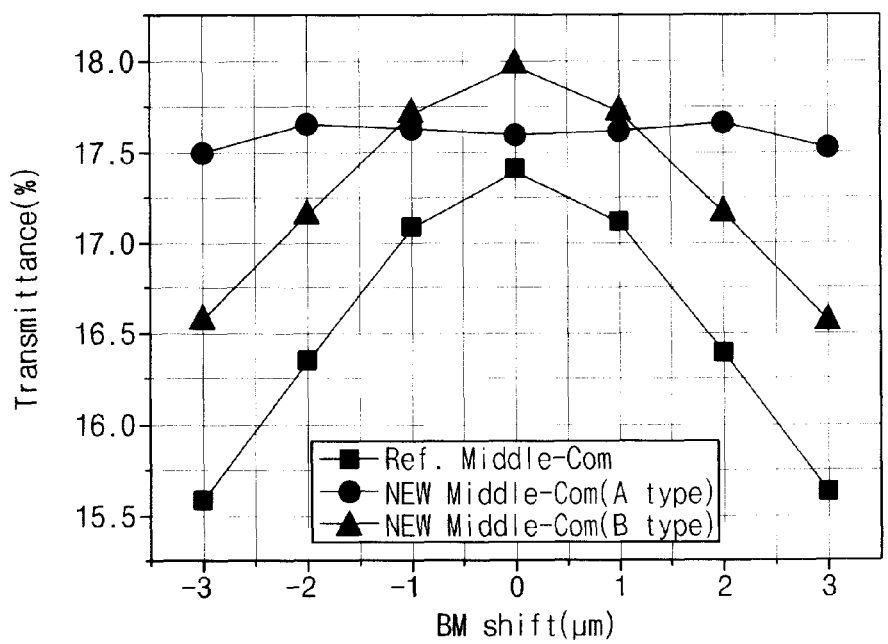
FIG. 17 is a graph showing change of a transmittance reduction, according to a black matrix shift of pixels illustrated in FIG. 2 and FIG. 8.

FIG. 17 is a graph showing transmittance reduction changes of pixels illustrated in FIG. 2 and FIG. 8, as a black matrix shifts. FIG. 17 is a graph showing transmittance reduction changes, as a black matrix shifts. A black matrix shift may occur in the course of manufacturing processes. To improve the reliability of a display substrate, a uniform transmittance is generally needed, even when a black matrix shifts.

Referring table and graph of FIG. 17, a transmittance is decreased by about 1.8%, when a black matrix shifts by maximum to 3 μm, in a conventional display substrate. Thus, the transmittance thereof is decreased by about 10%, as compared to when a black matrix does not shift. In contrast, a transmittance is decreased by about 0.1%, when a black matrix shifts by maximum to 3 μm, in the A-type display substrate. Thus, the transmittance thereof is decreased by about 0.56%, as compared to when a black matrix does not shift. A transmittance is decreased by about 1.4%, when a black matrix shifts by up to 3 μm in the B-type display substrate. Thus, the transmittance thereof is decreased by about 7.8%, as compare to a black matrix that does not shift.

Therefore, when a first sub-electrode is formed under a black matrix and on a data line, reduction of a transmittance can be reduced even though a black matrix shifts during manufacturing processes. Thus, reliability of a display substrate and a pixel transmittance may be improved.

A method for manufacturing a display substrate, according to various embodiments, may be formed via processes different from the above. The foregoing is illustrative of the present invention and is not to be construed as limiting thereof.

According to example embodiments of the present invention, a first sub-electrode is formed on a data line, such that a fringe field is formed at a peripheral portion of a pixel, between the first sub-electrode and the first pixel electrode. Therefore, liquid crystal molecules at the peripheral portion of the pixel may be rotated, so that a transmittance of a liquid crystal panel may be improved.

In addition, a first sub-electrode is formed under a black matrix and on a data line. Thus, a reduction of the transmittance can be reduced, even though a black matrix shifts during manufacturing. Thus, the reliability of a display substrate and a pixel transmittance may be improved.

Furthermore, a first sub-electrode is integrally formed with a first sub-electrode of an adjacent pixel, so that a same voltage is applied thereto. Therefore, light leakage does not occur in an area adjacent to the first sub-electrode.

Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims.

What is claimed is:

1. A display substrate, comprising:
a substrate having a pixel region;
a gate line disposed on the substrate and extending along a first edge of the pixel region;
a data line disposed on the substrate and extending across the gate line and along a second edge of the pixel region;
a first pixel electrode disposed on the substrate, in the pixel region, and overlapping the data line;
an insulation layer disposed on the first pixel electrode; and
a second pixel electrode comprising:
　a first sub-electrode disposed on the insulation layer and overlapping the first pixel electrode and the data line; and
　a second sub-electrode electrically connected to the data line through a switching element,
wherein the first pixel electrode is disposed between the data line and the first sub-electrode.

2. The display substrate of claim 1, wherein:
the first sub-electrode and the data line overlap along substantially all of the second edge of the pixel region; and
the first sub-electrode is electrically connected to the second sub-electrode.

3. The display substrate of claim 2, wherein:
the second pixel electrode further comprises an opening formed between the first and second sub-electrodes; and
the first and second sub-electrodes are generally bar-shaped, and end portions of the first and second sub-electrodes contact each other.

4. The display substrate of claim 1, wherein the first sub-electrode entirely overlaps the data line along substantially all of the second edge of the pixel region and is electrically connected to the first pixel electrode.

5. The display substrate of claim 4, wherein:
the first sub-electrode extends along the data line; and
the first and second sub-electrodes are spaced apart from each other.

6. The display substrate of claim 4, wherein the first sub-electrode is wider than the data line.

7. The display substrate of claim 4, wherein the first sub-electrode is electrically connected to the first pixel electrode through a first contact hole formed in the insulation layer.

8. The display substrate of claim 1, further comprising a common voltage line disposed on the substrate and electrically connected to the first pixel electrode.

9. The display substrate of claim 1, wherein the second pixel electrode is electrically connected to an output terminal of the switching element, through a contact hole formed in the insulation layer.

10. The display substrate of claim 1, wherein the display substrate comprises a plurality of the switching elements that are alternately disposed on opposing sides of the data line.

11. A method for manufacturing a display substrate, comprising:
forming a gate line on a substrate, the gate line extending along a first edge of a pixel region of the substrate;
forming a data line on the substrate, such that the data line extends across the gate line and along a second edge of the pixel region, the data line being connected to an input terminal of a switching element;
forming a first pixel electrode on the substrate, in the pixel region, and overlapping the data line;
forming an insulation layer on the first pixel electrode;
forming a second pixel electrode comprising:
　a first sub-electrode overlapping the first pixel electrode and the data line; and
　a second sub-electrode electrically connected to the data line through the switching element,
wherein the first pixel electrode is disposed between the data line and the first sub-electrode.

12. The method of claim 11, wherein:
the first sub-electrode and the data line overlap along substantially all of the second edge of the pixel region; and
the first electrode is electrically connected to the second sub-electrode.

13. The method of claim 11, wherein the first sub-electrode entirely overlaps the data line along substantially all of the second edge of the pixel region and is electrically connected to the first pixel electrode.

14. The method of claim 13, wherein the forming of the insulation layer comprises forming a first contact hole through the insulation layer, such that the first sub-electrode and the first pixel electrode are electrically connected to each other through the first contact hole.

15. The method of claim 11, wherein the forming of the gate line comprises forming a common voltage line on the substrate, the common voltage line being electrically connected to the first pixel electrode.

16. The method of claim 11, wherein the forming of the insulation layer comprises forming a second contact hole through the insulation layer, such that an output terminal of the switching element is electrically connected to the second sub-electrode through the second contact hole.

17. A display apparatus, comprising:
a display substrate having a pixel region a gate line disposed on a substrate and extending along a first edge of the pixel region;
a data line disposed on the substrate and extending across the gate line and along a second edge of the pixel region;
a first pixel electrode disposed on the substrate, in the pixel region, and overlapping the data line;
an insulation layer disposed on the first pixel electrode;
a second pixel electrode comprising:
　a first sub-electrode disposed on the insulation layer and overlapping the first pixel electrode and the data line; and
　a second sub-electrode electrically connected to the data line through a switching element;
an opposite substrate facing the display substrate;
a color filter disposed on the opposite substrate;
a black matrix disposed on the opposite substrate overlapping the data line and the first sub-electrode; and
a liquid crystal layer interposed between the display substrate and the opposite substrate,
wherein the first pixel electrode is disposed between the data line and the first sub-electrode.

18. The display apparatus of claim 17, wherein the black matrix is disposed only on the first sub electrode.

19. The display apparatus of claim 17, wherein:
the first sub-electrode and the data line overlap along substantially all of the second edge of the pixel region; and
the first sub-electrode is electrically connected to the second sub-electrode.

20. The display apparatus of claim 17, wherein the first sub-electrode entirely overlaps the data line along substantially all of the second edge of the pixel region and is electrically connected to the first pixel electrode.

21. The display apparatus of claim 20, wherein the black matrix is wider than the first sub-electrode.

* * * * *